(12) United States Patent
Ayai

(10) Patent No.: US 7,293,343 B2
(45) Date of Patent: Nov. 13, 2007

(54) METHOD OF MANUFACTURING SUPERCONDUCTING WIRE

(75) Inventor: Naoki Ayai, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 213 days.

(21) Appl. No.: 10/510,349

(22) PCT Filed: Jul. 30, 2003

(86) PCT No.: PCT/JP03/09704

§ 371 (c)(1),
(2), (4) Date: Oct. 6, 2004

(87) PCT Pub. No.: WO2004/013871

PCT Pub. Date: Feb. 12, 2004

(65) Prior Publication Data

US 2005/0172478 A1   Aug. 11, 2005

(30) Foreign Application Priority Data

Aug. 5, 2002   (JP) ............................. 2002-227040

(51) Int. Cl.
*H01L 39/24*   (2006.01)
(52) U.S. Cl. .................... 29/599; 505/100; 505/704
(58) Field of Classification Search ............... 29/599; 505/100, 704
See application file for complete search history.

(56) References Cited

U.S. PATENT DOCUMENTS

| | | | |
|---|---|---|---|
| 3,922,769 A * | 12/1975 | Brenan | ........................ 419/48 |
| 5,004,722 A | 4/1991 | Tallman | |
| 5,145,835 A * | 9/1992 | Takeshita et al. | ............ 505/432 |
| 5,369,088 A * | 11/1994 | Mukai et al. | ................ 505/432 |
| 5,462,920 A * | 10/1995 | Mukai et al. | ................ 505/432 |
| 6,493,925 B1 * | 12/2002 | Kaneko et al. | ................ 29/599 |

FOREIGN PATENT DOCUMENTS

EP   1 113 508 A2   7/2001

(Continued)

OTHER PUBLICATIONS

Supplementary European search report regarding EP/03 76 6668 Dec. 22, 2006.

*Primary Examiner*—Carl J. Arbes
(74) *Attorney, Agent, or Firm*—Foley & Lardner LLP

(57) ABSTRACT

A method of manufacturing a superconducting wire is provided. The method is provided with the steps of filling a raw material powder in a metal pipe, the raw material powder being composed of an oxide superconductor or a precursor to become an oxide superconductor through heat treatment; heating the metal pipe filled with the above-described raw material powder to 400° C. or more and 800° C. or less; depressurizing the inside of the above-described heated metal pipe to 100 Pa or less; sealing an opening at an end portion of the metal pipe under the above-described depressurized condition; and subjecting the sealed metal pipe containing the above-described raw material powder to wire drawing, wherein the packing density of the above-described raw material powder is controlled at 10 percent or more and 40 percent or less and, thereby, the degasification of the inside of the metal pipe is adequately performed, so that the critical current density can be increased.

10 Claims, 6 Drawing Sheets

FOREIGN PATENT DOCUMENTS

| | | | |
|---|---|---|---|
| JP | 05-234437 A | | 9/1993 |
| JP | 05-282936 A | | 10/1993 |
| JP | 06-176635 A | | 6/1994 |
| JP | 4-06309967 A | * | 11/1994 |
| JP | 06-309967 | * | 11/1994 |
| JP | 06-309967 A | | 11/1994 |
| JP | 6-342607 | * | 12/1994 |
| JP | 06-342607 A | | 12/1994 |
| JP | 07-105762 A | | 4/1995 |
| JP | 11-185551 A | | 7/1999 |
| JP | 2001-184956 A | | 7/2001 |

* cited by examiner

METHOD OF MANUFACTURING SUPERCONDUCTING WIRE

TECHNICAL FIELD

The present invention relates to a method of manufacturing a superconducting wire. In particular, it relates to a manufacturing method, wherein even in the case of making a long length of wire, an expansion and a degradation of crystal grain connectivity during sintering can be suppressed, and thereby, the critical current density (Jc) can be increased.

BACKGROUND ART

In a known conventional technology, a long length of tape-shaped wire is formed from oxide superconductor, e.g., a Bi2223 phase, by a powder-in-tube method. In this method, a raw material powder of a superconducting phase is filled in a metal pipe made of silver or the like. The resulting metal pipe filled with the raw material powder is subjected to wire drawing, so that a clad wire is produced. A plurality of clad wires are bound and inserted into a metal pipe made of silver or the like, and the wire drawing is performed, so that a multifilament wire is produced. The resulting multifilament wire is subjected to rolling, so that a tape shaped wire is produced. The tape shaped wire is subjected to a first heat treatment, so that the desired superconducting phase is generated. Subsequently, the resulting tape shaped wire is rolled again and, thereafter, is subjected to a secondary heat treatment, so that crystal grains in the superconducting phase are mutually bound. These two-time plastic deformation and heat treatment are performed generally in an atmosphere containing oxygen by 7 to 21 volume percent, although these may simply be performed once. Consequently, a tape shaped wire including a plurality of superconducting filaments in a metal sheath is produced.

However, there is a drawback in the conventional technology: that is, the residual gases in the inside of the raw material powder expand during the above-described first and secondary heat treatments such that voids are generated between crystals of the superconductor, or the gases and the raw material powder are combined such that amorphous phases are precipitated, and consequently connection between crystals of the superconductor is hindered, which results in the decrease in critical current density. In addition, there is a problem in that gases gather locally and, thereby, cause defects, e.g., blisters.

Japanese Unexamined Patent Application Publication No. 6-342607 discloses that after wire drawing, heat treatment is performed at 550° C. to 760° C. in a depressurized atmosphere so that adsorbed gases are removed from a raw material powder. However, in this technology, since the heat treatment is performed after the wire drawing, the gas permeability is poor, because the density of the raw material powder in the metal pipe increases as a result of the wire drawing. Consequently, it is difficult to adequately perform the degasification treatment. Since the end portion of the metal pipe is not sealed under depressurization, air and the like may enter into the metal pipe through the end of the metal pipe after the heat treatment is completed.

Japanese Unexamined Patent Application Publication No. 6-176635 discloses that an oxide powder is filled in a metal pipe in a vacuum or in an atmosphere at a humidity of 30 percent or less. However, in this technology, air may remain in the metal pipe. The residual air expands during the stages of the above-described first heat treatment and secondary heat treatment. Consequently, blisters occur, or connection between crystals is hindered, resulting in decrease of the critical current density.

Furthermore, Japanese Unexamined Patent Application Publication No. 6-309967 discloses that a rod-shaped material made of an oxide superconductor powder is encapsulated under vacuum into a metal pipe under depressurization of $1/10^3$ Torr (0.13 Pa) or less while heating in the range of 200° C. to 800° C. However, in this technique, degasification cannot be achieved adequately to the central portion of the metal pipe, because the gas permeability is poor, since the metal pipe is filled with the rod-shaped material, and not with a powder. The rod-shaped material may be abnormally deformed during a wire drawing step such that voids or the like are generated in the metal pipe, thereby decreasing the critical current density. The higher the heating temperature, the more the gases can be exhausted. However, adequate degasification cannot be achieved because the maximum temperature of possible heating is only about 700° C. to 750° C., since the powder may be decomposed if heated to 800° C. in a depressurized atmosphere of $1/10^3$ Torr or less.

DISCLOSURE OF INVENTION

An object of the present invention is to provide a method of manufacturing a superconducting wire, according to which method the critical current density can be increased by adequately performing degasification of the inside of a metal pipe.

In the present invention, a raw material powder for an oxide superconductor is filled in a metal pipe with a packing density of 10 percent or more and 40 percent or less, an end portion of the pipe is sealed under a depressurized condition and, thereafter, the sealed metal pipe containing the above-described raw material powder is subjected to wire drawing.

A method of the present invention for manufacturing a superconducting wire comprises the steps of filling a raw material powder in a metal pipe, the raw material powder being composed of an oxide superconductor or a precursor to become an oxide superconductor through heat treatment; heating the metal pipe filled with the raw material powder to 400° C. or more and 800° C. or less; depressurizing the inside of the heated metal pipe to 100 Pa or less; sealing an opening at an end portion of the metal pipe under such depressurized condition; and subjecting the sealed metal pipe containing the raw material powder to wire drawing. The packing density of the above-mentioned raw material powder is 10 percent or more and 40 percent or less.

Furthermore, the step of heat-treating at 400° C. or more and 800° C. or less may be applied to the raw material powder before the step of filling in the metal pipe the raw material powder that is composed of an oxide superconductor or a precursor to become an oxide superconductor through heat treatment.

The raw material powder for a superconductor contains gases, such as air, adsorbed gases (steam, carbon, hydrocarbons, and the like) adsorbed by the raw material powder during the manufacturing steps (in general, from the step of mixing to the step of sintering) of the raw material powder as described below, excess oxygen, and the like. In the past, when these gases were liberated to the outside of the raw material powder during the final heat treatment step (first heat treatment, secondary heat treatment) after the processing into a wire was done, they caused voids between crystals of the superconductor, or some gases were combined with the raw material powder so as to generate amorphous phases. These voids and amorphous phases hindered connection between crystals, thereby decreasing the critical current density. Furthermore, some of the gases liberated from the raw material powder and remaining in the pipe without being discharged from the metal pipe caused defects such as blisters in the wire.

Therefore, in the present invention, after the raw material powder for the superconductor is filled in the metal pipe, a degasification treatment (depressurization) in the metal pipe is performed in order to discharge gases and vaporized water and the like, which become gases, all of which are included in the raw material powder. At this time, the packing density of the raw material powder is controlled in order to achieve good gas permeability so that the discharge of gases to the outside of the metal pipe may not hindered by the raw material powder.

The raw material powder for the superconductor is filled in the metal pipe with the above-described filling factor, heating is performed and, thereafter, an end portion of the metal pipe is sealed under the condition in which the inside of the metal pipe is depressurized. Consequently, new water and carbon dioxide in air can be prevented from entering the pipe which has been subjected to the degasification treatment.

Furthermore, gases and water or the like serving as a source of gases, which are included in the raw material powder, can be removed more effectively by providing a process in which the raw material powder, which is composed of an oxide superconductor or a precursor to become an oxide superconductor through heat treatment, is subjected to heat-treatment at 400° C. or more and 800° C. or less before the raw material powder is filled in the metal pipe.

BEST MODE FOR CARRYING OUT THE INVENTION

Figure 1:
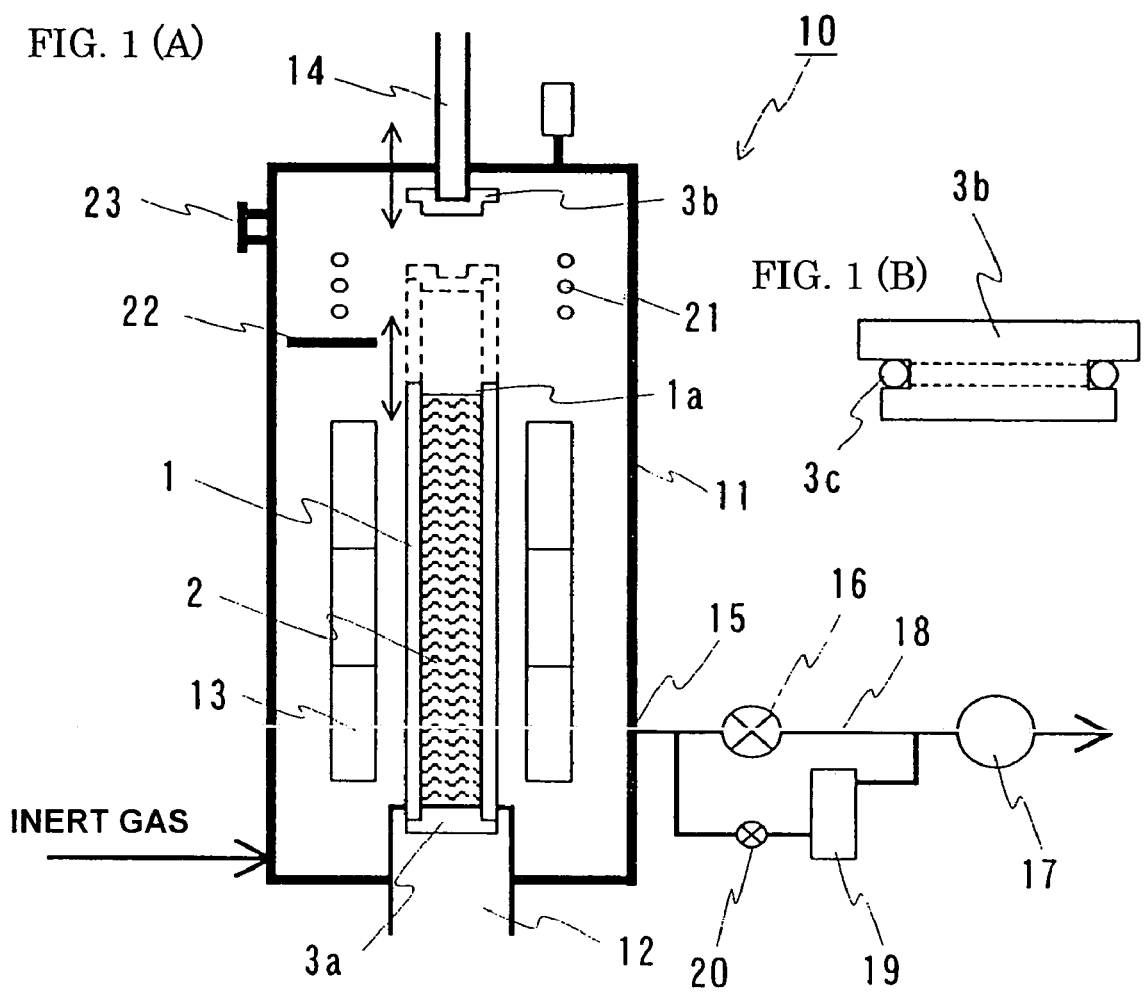
FIG. 1(A) is a schematic diagram of a vacuum sealing apparatus for performing sealing of a metal pipe by heating and brazing.
FIG. 1(B) is a magnified sectional view of a lid.

Embodiments of the present invention will be described as follows. In the explanations of the drawings, the same element is indicated by the same reference numeral and explanation thereof will not be repeated. The dimensional ratios in the drawings do not always agree with those in the explanations.

(Outline of Manufacturing Process)

For example, the production of a multifilament wire is followed by the processes: production of a tape-shaped wire by a first rolling→a first heat treatment→a secondary rolling of the tape-shaped wire→a secondary heat treatment. If necessary, the rolling and the heat treatment are repeated plural times. In particular, the method of the present invention for manufacturing a superconducting wire specifies the condition of manufacturing a clad wire, comprising the steps of "filling a prepared raw material powder in a metal pipe→degasification treatment (heating)→degasification treatment (depressurization)→sealing of the metal pipe under a degassed condition→wire drawing". In particular, the method of the present invention for manufacturing a superconducting wire specifies the condition of manufacturing a clad wire, comprising the steps of "filling a prepared raw material powder in a metal pipe→degasification treatment (heating)→degasification treatment (depressurization)→sealing of the metal pipe under a degassed condition→wire drawing". The other steps may be performed as in the conventional manner.

(Raw Material Powder)

In the present invention, the raw material powder to be filled in the metal pipe is specified to be a raw material powder composed of an oxide superconductor or a precursor to become an oxide superconductor through heat treatment. Specific examples of such powders are a powder prepared by mixing complex oxides so as to attain a predetermined compositional ratio (a powder composed of a precursor), and a powder prepared by sintering and pulverizing the resulting mixed powder (a powder composed of an oxide superconductor); for example, Bi2212, Bi2223, and the like. With respect to Bi2223, preferably, a precursor is used as the raw material powder because integration can be achieved more easily by sintering, and thereby the critical current density can be further increased. With respect to Bi2212, preferably, a powder composed of an oxide superconductor is used because the critical current density can thereby be increased.

An example of methods of producing finally a Bi2223-based superconducting wire is a method in which Bi, Pb, Sr, Ca, and Cu are used as starting raw materials, and these powders are sintered at least once at 700° C. to 870° C. for 10 to 40 hours in the air atmosphere or in a depressurized atmosphere. In addition, conventional methods, e.g., a nitrate solution spray pyrolysis method and a sol-gel method, are used. By these methods, a raw material powder (a mixture of Bi2212, $Ca_2CuO_3$, $Ca_2PbO_4$, and the like) primarily composed of a Bi2212 phase rather than of a Bi2223 phase can be produced.

Specifically, the composition of $Bi_aPb_bSr_cCa_dCu_e$ preferably satisfies compositional ratio a+b:c:d:e=1.7 to 2.8:1.7 to 2.5:1.7 to 2.8:3. Particularly, a composition in which Bi or Bi+Pb:Sr:Ca:Cu=2:2:2:3 is dominant is suitable. In particular, preferably, Bi is about 1.8, Pb is 0.3 to 0.4, Sr is about 2, Ca is about 2.2, and Cu is about 3.0.

If necessary, the raw material powder may be heat-treated at 400° C. or more and 800° C. or less before the step of being filled in the metal pipe and, thereby, gases, water and the like serving as a source of gases, which are included in the raw material powder, can be removed more effectively.

(Metal Pipe)

Preferably, the material for the metal pipe is a metal selected from Ag, Cu, Fe, Ni, Cr, Ti, Mo, W, Pt, Pd, Rh, Ir, Ru, and Os or an alloy based on these metals. In particular, Ag or an Ag alloy is preferable from the viewpoint of the reactivity with the oxide superconductor and the workability.

(Packing Density)

In the present invention, when the raw material powder is filled in the metal pipe, a suitable packing density is 10 percent or more and 40 percent or less. If the packing density is less than 10 percent, the amount of the raw material powder is too small and, therefore, uniform filling in the metal pipe is difficult. On the other hand, if the packing density exceeds 40 percent, the amount of the raw material powder is too large and, therefore, the following problems occur.

(1) The gas permeability of the metal pipe becomes poor and, thereby, degasification cannot be uniformly performed as far as the central portion of the metal pipe, while degasification can be performed in the vicinity of the opening at the pipe end portion.
(2) Some parts are hardened due to sintering and, thereby, the workability of the metal pipe becomes poor.
(3) Abnormal deformations, e.g., sausage-shaped deformations (i.e., variations in locations of filaments in a cross section of the metal pipe), occur during wire drawing.

In the present invention, a packing density means a proportion (percent) relative to a theoretical density of the raw material powder to be filled in, where the theoretical density is assumed to be 100 percent. The theoretical density of the raw material powder to be filled in is represented by the sum total of the individual products of the theoretical densities of individual constituent phases and the content ratios thereof with respect to all constituent phases of the material powders, that is, $\Sigma \rho_i \times f_i$ ($\rho_i$: the theoretical density of a constituent phase i of the raw material powder, $f_i$: the content ratio of the constituent phase i in the raw material powder).

(Degasification Treatment (Depressurization))

In the present invention, the ultimate pressure in the degasification treatment (depressurization) is controlled at 100 Pa or less. If the ultimate pressure exceeds 100 Pa, the amount of residual gases is large and, therefore, the effect of degasification is poor. Preferably, the depressurization speed from normal pressure to the ultimate pressure is 2 kPa/min or less. If the speed exceeds 2 kPa/min, the pressure within the interstices of the raw material powder in the pipe cannot change in accordance with the depressurization speed, and therefore, the raw material powder may be blown up in the metal pipe and spout from the pipe.

(Degasification Treatment (Heating))

In the degasification treatment (heating), the metal pipe is heated to some extent and, thereafter, exhausting is performed gradually. Preferably, the degasification treatment (heating) is performed by heating the metal pipe filled with the raw material powder to 400° C. or more and 800° C. or less. When the temperature is 400° C. or more, the effect of degasification can be produced effectively. Gases can be discharged more reliably as the temperature becomes high. However, if the temperature exceeds 800° C., the raw material powder may decompose. Consequently, the temperature is controlled at 800° C. or less in the present invention. The degasification treatment (heating) may be performed at atmospheric pressure. The temperature preferably is raised to 400° C. at atmospheric pressure, exhausting is performed gradually after the temperature exceeds 400° C., and heat treatment is performed at 400° C. or more and 800° C. or less in a depressurized state, more preferably in a vacuum, because thereby the effect of degasification becomes high. The temperature is raised to at least 400° C. at atmospheric pressure (normal pressure) and, thereafter, depressurization is performed. This is because if the raising of temperature and the depressurization are performed simultaneously, the raw material powder may issue in a jet from the metal pipe in accordance with the discharge of gases. The time for keeping the temperature at 400° C. or more and 800° C. or less may be appropriately changed depending on the diameter, the length, and the like of the metal pipe. For example, when the metal pipe has the inner diameter of 20 to 30 mm and the length of 500 to 1,500 mm, preferably, the time is 2 to 10 hours, and may also be appropriately changed depending on the state of the raw material powder filled in and the performance of a vacuum pump.

(Sealing of Metal Pipe)

In the present invention, as described above, the opening at the end portion of the metal pipe is sealed under the depressurized condition of 100 Pa or less. That is, the inside of the metal pipe is depressurized so that the infill of a new gas is suppressed, and in addition, the opening at the end portion of the metal pipe is sealed so that a new gas is prevented surely from entering into the pipe. Since the wire drawing is performed in a state in which the metal pipe is sealed, a suitable sealing method is a joining method which enables the sealing to withstand to the wire drawing and which can be applied to vacuum sealing. Specific examples thereof include electron beam welding, brazing, and pressure welding of an exhaust nozzle welded to the metal pipe.

(Wire Drawing)

In the present invention, the wire drawing is performed under the condition in which the end portion of the metal pipe filled with the raw material powder is sealed, as described above.

EXPERIMENTAL EXAMPLE 1

In the manufacturing process of a clad wire, the step of depressurizing the inside of the pipe and the step of sealing the metal pipe end portion under a depressurized condition were performed with varying packing densities of the raw material powder and, thereby, superconducting wires were produced. Subsequently, the presence or absence of any defects, e.g., blister, and the critical current density were examined.

(1) In a manner similar to a conventional method, individual powders of $Bi_2O_3$, PbO, $SrCO_3$, $CaCO_3$, and CuO were mixed to produce a mixed powder such that the ratio of individual elements of Bi, Pb, Sr, Ca, and Cu becomes 1.8:0.3:1.9:2:3, and heat treatments were performed several times at 800° C. or more in the atmosphere, and pulverizing were performed after each heat treatment. In this manner, a raw material powder of an oxide superconductor composed of a mixture of Bi2212, $Ca_2CuO_3$, $Ca_2PbO_4$, and the like was prepared. The packing density indicates the proportion of an actual density relative to the theoretical density of the raw material powder to be filled in, where the theoretical density is assumed to be 100 percent. The packing density was varied as described below. The packing density of 30 percent or more and 40 percent or less was attained by filling a powder granulated from the raw material powder with a wet-type granulator. The packing density exceeding 40 percent was attained by filling a rod-shaped molded material, which was produced by molding the raw material powder using a CIP (hydrostatic press).

(2) The raw material powder or the molded material thereof, which was subjected to evacuation to about 100 Pa, and if necessary, heat treatment of 700° C.×10 hours, immediately before filling in a silver pipe in order to remove adsorbed gas components beforehand, was filled in a silver pipe in a glove box cleaned by flowing dry air gas. Here, the heat treatment before the filling may be performed in an inert gas, e.g., nitrogen or argon, or in dry air from which water has been removed, besides the evacuation. Likewise, the filling into the silver pipe may be performed in an inert gas or in a vacuum: similar effects can be obtained in either case. The silver pipe used in the present example was provided with a silver lid on the opening at one end by welding, and had a thickness of 2 mm and an inner diameter of 30 mm.

(3) The inside of the silver pipe filled with the raw material powder was depressurized to 100 Pa or less at a speed of 2 kPa/min.

(4) A silver lid was attached by brazing on the opening at the other end of the silver pipe so as to seal it while void portions present in the silver pipe were maintained in a vacuum (100 Pa or less). Here, when the depressurization was performed at a speed of 2 kPa/min or more, the pressure difference in the inside of the silver pipe was increased such that occasionally the powder was pushed out to the outside. In the present example, the steps from the degasification treatment to the brazing were performed with a vacuum sealing apparatus shown in FIG. 1.

(5) The wire drawing is performed to form a wire in a state in which the silver lid is sealed in order to prevent air and the like from entering into the silver pipe. Thus, a clad wire is produced. The following procedures are similar to those in the conventional manufacturing method.

(6) A plurality of clad wires are bound and inserted into a silver pipe (outer diameter 36 mm, inner diameter 30 mm). The openings at the end portions of this pipe are sealed with silver lids in a vacuum. In the present example, 55 clad wires were used.

(7) A multifilament wire is produced by performing wire drawing in a state where the silver lids are sealed in order to prevent air and the like from entering into the silver pipe. In the present example, the wire drawing was performed until the diameter became 1.6 mm.

(8) The multifilament wire is rolled into a tape shape having a width of 4 mm and a thickness of 0.2 mm, so that a tape-shaped wire is produced.

(9) The tape-shaped wire having a length of 500 m is subjected to a first heat treatment in order to generate a Bi2223 phase superconductor in the filaments. Furthermore, intermediate rolling and an additional heat treatment are performed to mutually connect crystal grains in the Bi2223 phase and, thereby, to integrate superconductors.

Figure 2:
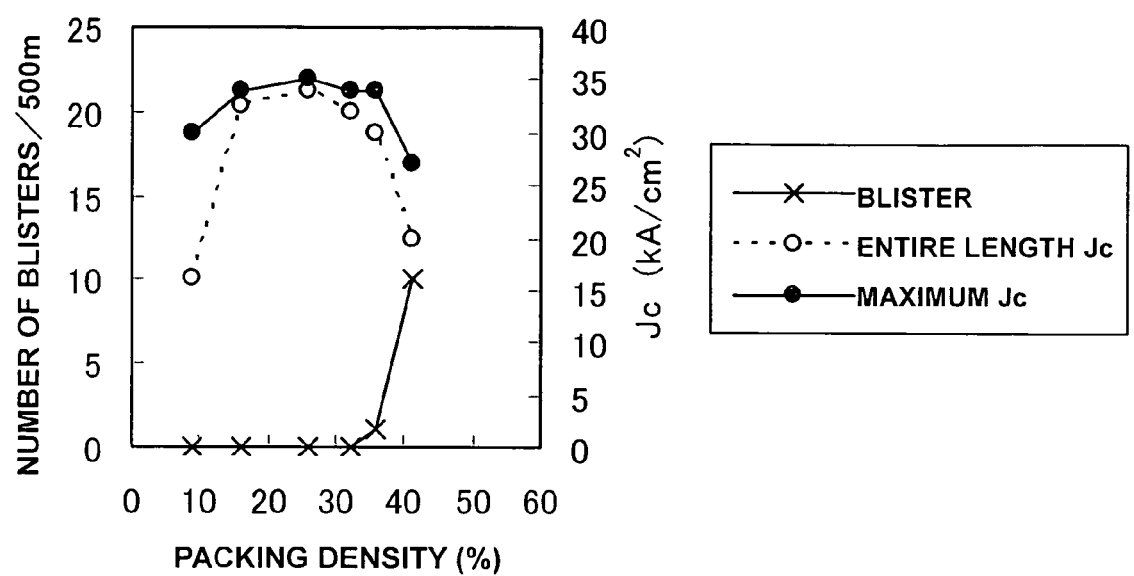
FIG. 2 is a graph showing the number of defects, e.g., blisters, and critical current densities, relative to packing densities in Experimental example 1.

The superconducting wires produced in a manner as described above were examined with respect to the number of defects, e.g., blisters, caused in the wires after the first heat treatment. Furthermore, the critical current density (Jc) at 77 K in the self magnetic field was measured with respect to the wires which have been subjected to the additional heat treatment. The results thereof are shown in FIG. 2.

When the packing density exceeded 50 percent, defects occurred during the wire drawing and, consequently a long length of wire could not be produced. As shown in FIG. 2, when the packing density exceeded 40 percent, blisters occurred and, thereby, the critical current density was decreased. When the packing density was less than 10 percent, no defect, e.g., blister, occurred. However, significant variations in the critical current density were observed in the lengthwise direction of the superconducting wire, and the critical current density of the entire length was decreased. The reason for this is presumably that when the packing density was less than 10 percent, the raw material powder had a tendency to be filled unevenly into a metal pipe, and the filaments formed by the wire drawing became nonuniform in the lengthwise direction.

When the packing density was 10 percent or more and 40 percent or less, defects, e.g., blisters, were reduced and, in addition, a high critical current density was attained with respect to the entire length of the superconducting wire.

EXPERIMENTAL EXAMPLE 2

In the manufacturing process of a clad wire, the degasification treatment was performed with varying heating temperatures and, thereby, superconducting wires were produced. Subsequently, the presence or absence of any defects, e.g., blister, and the critical current density were examined.

The superconducting wires were produced as described below.

(1) In a manner similar to that in the conventional method, individual powders of Bi, Pb, Sr, Ca, and Cu are mixed at the ratio of 1.8:0.3:1.9:2:3 to produce a mixed powder, and heat treatments are performed several times in the atmosphere at 800° C. or more. Pulverizing is performed after each heat treatment. The resulting powder is further subjected to heat treatment of 800° C.×2 hours, so as to prepare a raw material powder. The raw material powder (a mixture of Bi2212, $Ca_2CuO_3$, $Ca_2PbO_4$, and the like) for an oxide superconductor is filled in a silver pipe, while the content of adsorbed gas components in the raw material powder is decreased beforehand by the heat treatment, as described above. The filling of the raw material powder is performed in a glove box cleaned by flowing dry air. The silver pipe used in the present example was provided with a silver lid on the opening at one end by welding, and had a thickness of 2 mm and an inner diameter of 30 mm. In the present example, when the raw material powder was filled in the silver pipe, the packing densities of all samples were controlled at 25 percent.

(2) The silver pipe with the raw material powder filled therein is heated to a predetermined temperature (in the present example, 0° C. to 650° C., refer to FIG. 3 described below), and degasification treatment is performed. In the present example, the temperature is raised to 400° C. at atmospheric pressure, and when the temperature reaches 400° C. or more, heating is performed while exhausting is performed gradually so as to depressurize.

(3) After the temperature is raised as described above, the inside of the silver pipe is depressurized to 100 Pa or less while the heating is continued appropriately. The depressurization speed was controlled at 2 kPa/min when depressurization was performed from atmospheric pressure to 100 Pa or less. Subsequently, the pressure was maintained at 100 Pa or less for 10 hours.

(4) A silver lid was brazed on the opening at the other end of the silver pipe so as to seal while void portions present in the silver pipe were maintained in a vacuum (100 Pa or less). In the present example, the steps from the degasification treatment to the sealing by brazing were performed with a vacuum sealing apparatus shown in FIG. 1.

FIG. 1(A) is a schematic diagram of a vacuum sealing apparatus for performing sealing of a metal pipe by heating and brazing. FIG. 1(B) is a magnified sectional view of a lid.

This vacuum sealing apparatus 10 is provided with a lift cylinder 12 holding a metal pipe 1 in a vacuum vessel 11, a heater 13 disposed to cover the perimeter of the pipe 1 supported with the cylinder 12, and a manipulation rod 14 disposed to face the cylinder 12 while holding a lid 3b of the pipe 1 at one end. In addition, an exhaust hole 15 is provided in order to exhaust gases generated due to the heating and air and the like during depressurization.

The procedures from a degasification treatment to sealing of the metal pipe 1 with this vacuum sealing apparatus 10 will be described. The vacuum vessel 11 is opened, the metal pipe 1, which is provided with a lid 3a welded at one end and in which a raw material powder 2 is filled, is disposed on the cylinder 12, the lid 3b is disposed at the end of the manipulation rod 14, and the vacuum vessel 11 is closed. The lift cylinder 12 is located at an appropriate position by being moved vertically so as to dispose the metal pipe 1 in the inner perimeter side of the heater 13, and the pipe 1 is heated with the heater 13. After the heating is performed, an exhaust valve 16 is opened, and the air is exhausted from the vacuum vessel 11 with a vacuum pump 17 so as to depressurize. In the present example, an exhaust pipe 18 is provided with a flow control meter 19, the flow rate of exhausting is controlled with the meter 19 and, thereby, the depressurization speed can be controlled. When the depressurization to a predetermined pressure is completed, the exhaust valve 16 and a meter valve 20 are closed. The manipulation rod 14 is moved downward, the lid 3b is disposed in the inner perimeter side of a high-frequency induction heating coil 21 provided above the heater 13, and ring shaped solder 3c (refer to FIG. 1(B)) disposed on the lid 3b is melted with the coil 21. A shutter 22 having a thermal insulation property is provided between the heater 13 and the high-frequency induction heating coil 21 so that their mutual heat does not affect each other. When the solder 3c on the lid 3b is melted, the lift cylinder 12 is moved upward, the manipulation rod 14 is moved downward and, thereby, the opening 1a at the other end of the metal pipe 1 is sealed. At this time, the manipulation rod 14 is moved downward while the location of the opening 1a of the metal pipe 1 is checked through an observation window 23. In the present example, the manipulation rod was a manual type, but it may be an automatic type. The metal pipe is sealed in accordance with the above-described procedures.

(5) The wire drawing is performed to form a wire while the silver lid is left sealed in order to prevent air and the like from entering into the silver pipe. Thus, a clad wire is produced. The following procedures are similar to those in the conventional manufacturing method.

(6) A plurality of clad wires are bound and inserted into a silver pipe (outer diameter 36 mm, inner diameter 30 mm). The openings at the end portions of this pipe are sealed with silver lids in a vacuum. In the present example, 55 clad wires were used.

(7) The wire drawing is performed to form a wire while the silver lids are left sealed in order to avoid the infall of air and the like into the silver pipe, so that a multifilament wire is produced. In the present example, the wire drawing was performed until the diameter became 1.6 mm.

(8) The multifilament wire is rolled into a tape-shaped wire having a width of 4 mm and a thickness of 0.2 mm.

(9) The tape shaped wire having a length of 500 m is subjected to a first heat treatment in order to generate a Bi2223 phase superconductor in the filament. Furthermore, intermediate rolling and an additional heat treatment are performed to mutually connect Bi2223 phase crystal grains and, thereby, to integrate them into a superconductor.

With respect to the superconducting wires produced as described above, the number of defects, e.g., blisters, caused in the wires after the first heat treatment was examined. Furthermore, the critical current density (Jc) at 77 K in the self magnetic field was measured with respect to the wires which had been subjected to the additional heat treatment. The results thereof are shown in FIG. 3.

Figure 3:
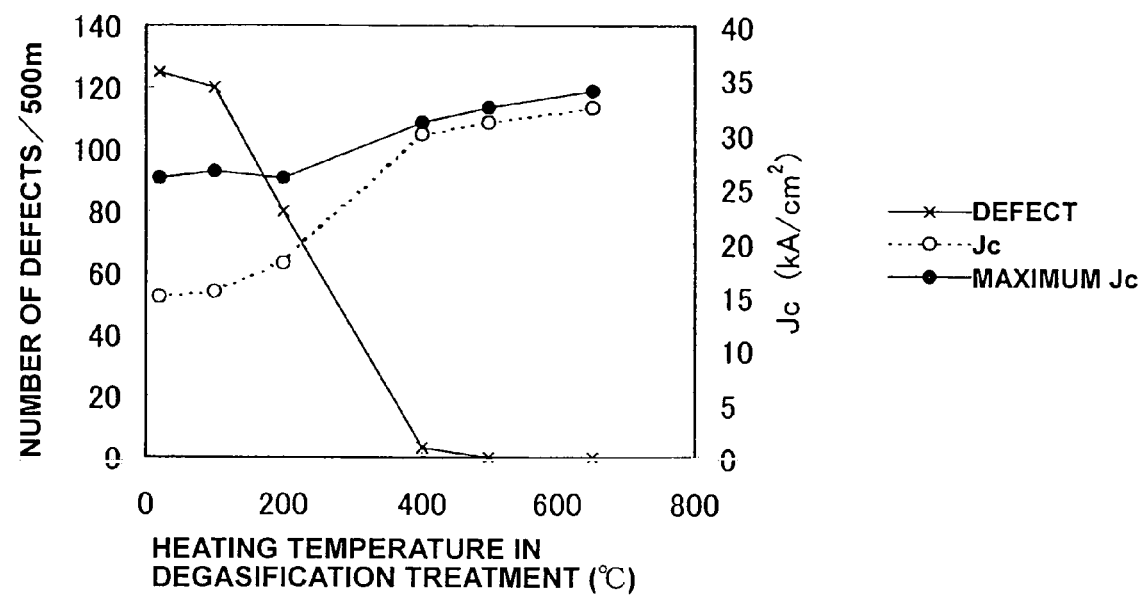
FIG. 3 is a graph showing the number of defects, e.g., blisters, and critical current densities, relative to heating temperatures in a degasification treatment in Experimental example 2.

As shown in FIG. 3, in the cases where the heating temperature in the degasification treatment was 400° C. or more, almost no defects, e.g., blisters, were observed even in a long superconducting wire having a length of 500 m. On the other hand, when the temperature was less than 400° C., the amount of residual impurities, e.g., water and carbon, was large, and blisters occurred. Furthermore, when the heating temperature in the degasification treatment was 400° C. or more, the critical current densities (Jc) of the entire length exhibited very high values as compared with those in the cases where the temperature was less than 400° C. Likewise, maximum values of the critical current densities in the cases where the degasification treatment was 400° C. or more were larger than those in the cases where the temperature was less than 400° C.

Figure 4:
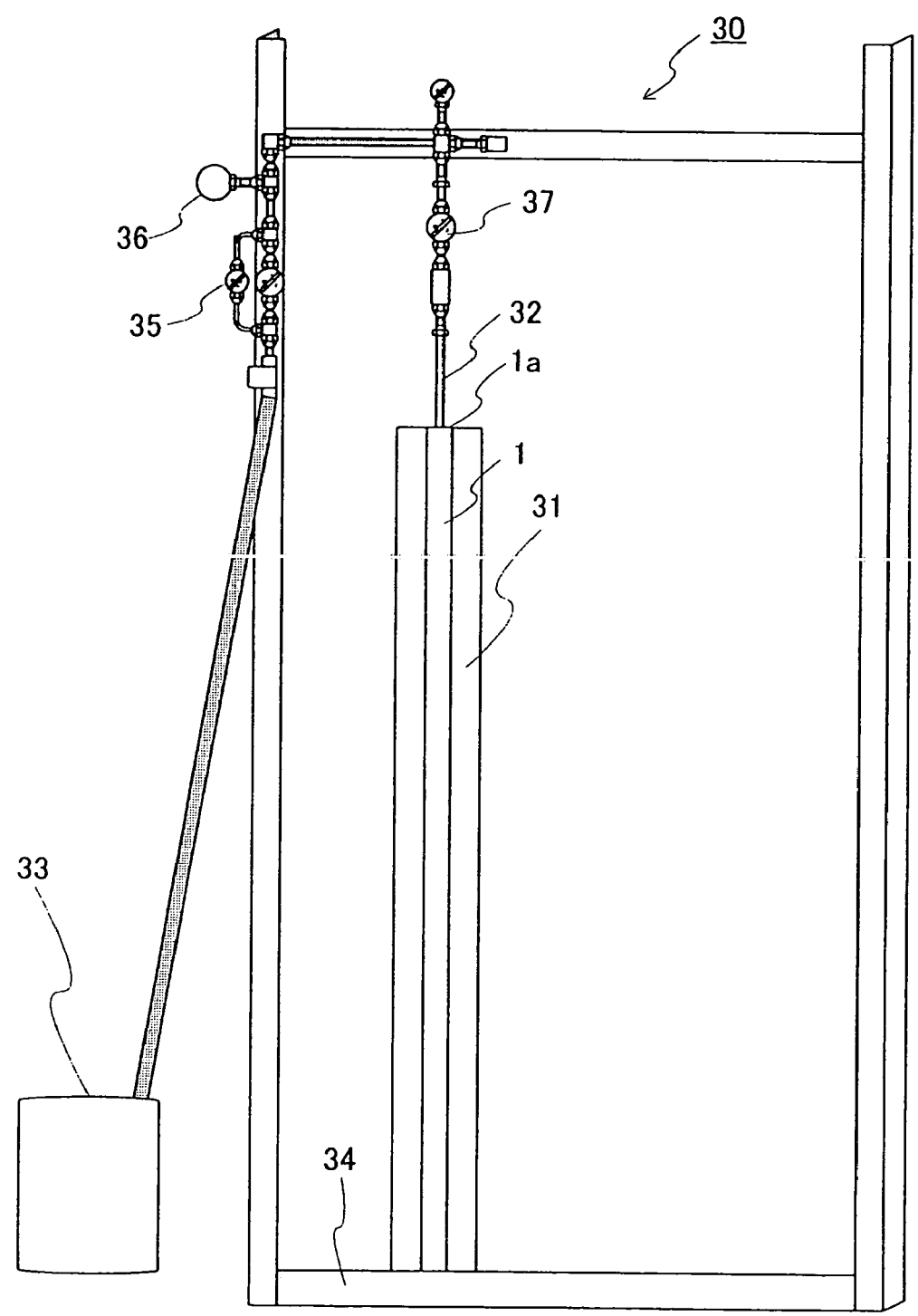
FIG. 4 is a schematic diagram of a vacuum sealing apparatus for performing sealing by heating a metal pipe and pressure welding of an exhaust nozzle. The apparatus is of the type in which the metal pipe is supported in a vertical direction.
Figure 5:
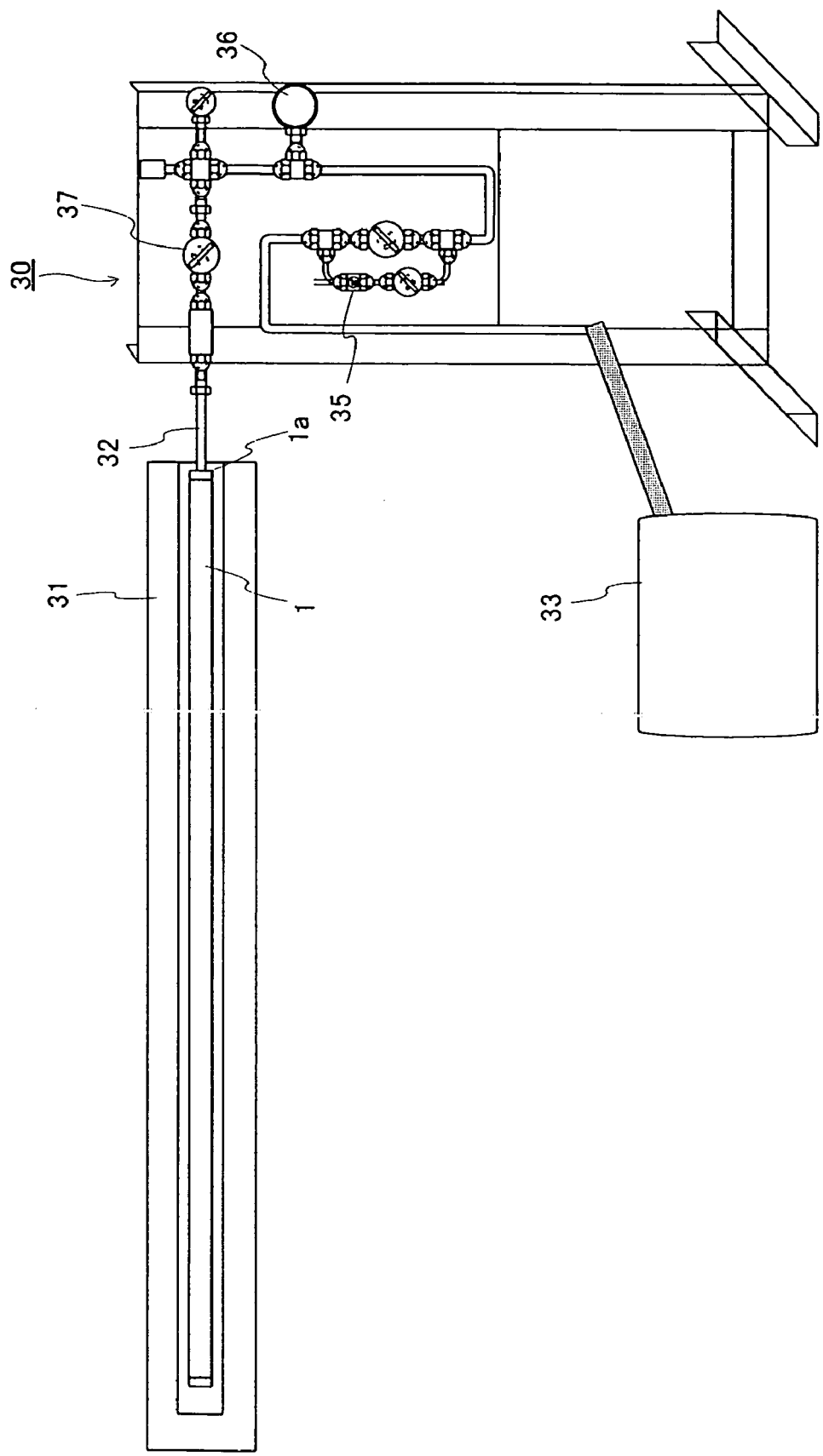
FIG. 5 is a schematic diagram of a vacuum sealing apparatus for performing sealing by heating a metal pipe and by pressure welding of an exhaust nozzle. The apparatus is of the type in which the metal pipe is supported in a horizontal direction.

In the present example, the vacuum sealing apparatus which employed brazing was used. However, the metal pipe may be sealed by welding the lid through the use of electron beam, or the metal pipe may be sealed by pressure welding of the exhaust nozzle shown in FIG. 4 or 5. The apparatuses shown in FIGS. 4 and 5 are vacuum sealing apparatuses which employ the pressure welding of exhaust nozzles. Both apparatus have substantially the same basic configuration: FIG. 4 shows an apparatus of the type in which a metal pipe is supported in a vertical direction, and FIG. 5 shows an apparatus of the type in which a metal pipe is supported in a horizontal direction. The procedures for sealing the metal pipe with these apparatuses will be described with reference to FIG. 4. The apparatus 30 is provided with a heater 31 disposed to cover the perimeter of the metal pipe 1, an exhaust nozzle 32 attached to an opening 1a of the end portion of the pipe 1, and a vacuum pump 33 connected to the nozzle 32. In this apparatus 30, the metal pipe 1 filled with a raw material powder is disposed on a frame 34, and the exhaust nozzle 32 is welded to the opening 1a of the end portion of the pipe 1. Under this condition, the metal pipe 1 is heated with the heater 31. After the heating is completed, gases present in the metal pipe 1 are exhausted with a vacuum pump 33 through the exhaust nozzle 32 so as to depressurize. The flow rate of exhausting is controlled with a flow rate control valve 35 during depressurization and, thereby, the depressurization speed can be controlled. The degree of vacuum can be checked with a vacuum gauge 36. When the depressurization to a predetermined pressure is completed, the valve 37 is closed and the vacuum pump 33 is disconnected. The exhaust nozzle 32 is pressure-welded with a pressure welder (not shown in the drawing) and, thereby, the opening at the end portion of the metal pipe is sealed. After the pressure welding is completed, the metal pipe 1 is removed from the apparatus 30.

EXPERIMENTAL EXAMPLE 3

Superconducting wires were produced, with varying packing densities of the raw material powder in the process of manufacturing clad wires, and, subsequently, the presence or absence of any defect, e.g., blister, and the critical current density were examined.

The superconducting wires were produced as in Experimental example 2. The packing density indicates a proportion of an actual density relative to the theoretical density of the raw material powder to be filled in, where the theoretical density is assumed to be 100 percent. The packing density was varied as described below. The packing density of 30 percent or more and 40 percent or less was attained by filling a powder granulated from the raw material powder with a wet-type granulator. The packing density exceeding 40 percent was attained by filling a rod-shaped material produced by molding the raw material powder with a CIP (hydrostatic press). The heating temperature in the degasification treatment was controlled at 640° C. The temperature was raised to 400° C. at atmospheric pressure, and when the temperature reached 400° C. or more, heating was performed while exhausting was performed gradually so as to depressurize.

The superconducting wires produced as in Experimental example 2 were examined with respect to the number of defects, e.g., blisters, after the first heat treatment as in Experimental example 2. Furthermore, with respect to the wires subjected to the additional heat treatment, the critical current densities (Jc) at 77 K in the self magnetic field were measured. The results thereof are shown in FIG. 6.

Figure 6:
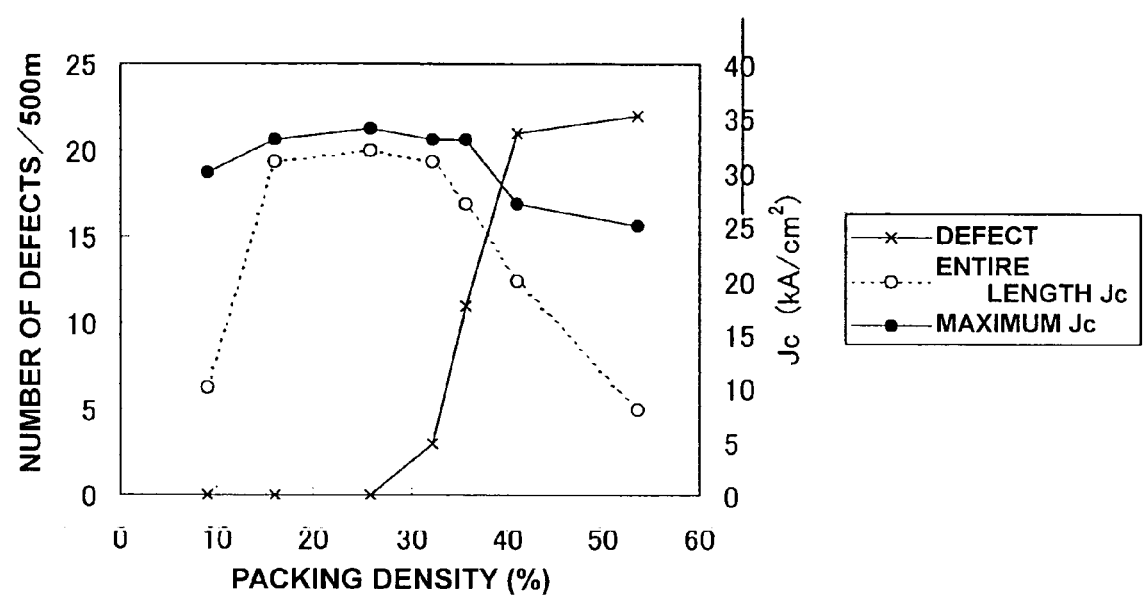
FIG. 6 is a graph showing the number of defects, e.g., blisters, and critical current densities, relative to packing densities in Experimental example 3.

As shown in FIG. 6, in the cases where the packing density was 10 percent or more and 40 percent or less, the number of defects, e.g., blisters, was relatively small and, in addition, high critical current densities (Jc) were attained with respect to the entire length of the superconducting wires. In this range, maximum values of the critical current densities were also high. In particular, it is clear that a packing density in the range of 10 percent or more and 30 percent or less is more preferable, because almost no defects, e.g., blister, were observed in the cases of such packing densities. The superconducting wires having a packing density in the range of 30 percent or more and 40 percent or less tended to be inferior in terms of workability as compared with the superconducting wires having a packing density in the range of 10 percent or more and 30 percent or less. This tendency became more remarkable as the packing density was increased.

On the other hand, when the packing density was less than 10 percent, no defects, e.g., blister, occurred. However, significant variations in the critical current density were observed in the lengthwise direction of the superconducting wire, and the critical current density of the entire length was decreased. The reason for this is believed that when the packing density was less than 10 percent, the raw material powder tended to be unevenly filled into the metal pipe, and the filaments after being subjected to the wire drawing became nonuniform in the lengthwise direction.

On the other hand, when the packing density exceeded 40 percent, a considerable number of defects, e.g., blisters, occurred, significant variations in the critical current density were observed in the lengthwise direction of the superconducting wire, and the critical current density of the entire length was decreased. It is believed that when the packing density exceeds 40 percent, the gas permeability of the metal pipe becomes poor, degasification cannot be adequately performed as far as the central portion of the pipe, the amount of residual impurities, e.g., carbon and water, increases, and defects, e.g., blisters occur. The critical current density is decreased, presumably because of the reasons that residual impurities precipitate as an amorphous phase between crystals in the superconducting phase and this amorphous phase tends to interrupt the path of an electrical current, and that sintering action becomes remarkable due to the residual impurities during the degasification treatment, thereby causing abnormal deformations, e.g., sausage-shaped deformations, during the subsequent wire drawing.

INDUSTRIAL APPLICABILITY

As described above, according to the method of the present invention for manufacturing a superconducting wire, an excellent effect can be achieved, that is, a high critical current density can be attained even in a long length of superconducting wire, as a result of manufacturing steps in which the metal pipe filled with the raw material powder is heated and subjected to a degasification treatment, followed by depressurization, whereby the occurrence of blisters, reduction of crystal grain connectivity, and the like, being suppressed during the sintering. In particular, the packing density of the raw material powder to be filled in is specified and, thereby, the raw material powder can be uniformly filled in the metal pipe, and variations in the critical current density can be reduced along a longitudinal direction of the superconducting wire. Furthermore, the degasification treatment is performed adequately and, thereby, the generation of an amorphous phase and abnormal deformation during wire drawing are suppressed. Consequently, the critical current density can be increased.

The invention claimed is:

1. A method of manufacturing a superconducting wire, comprising the steps of:
   filling a raw material powder in a metal pipe, the raw material powder being composed of an oxide superconductor or a precursor to become an oxide superconductor through heat treatment;
   depressurizing the inside of the metal pipe;
   sealing an opening at an end portion of the metal pipe under the depressurized condition; and
   subjecting the sealed metal pipe containing the raw material powder to wire drawing,
   wherein the packing density of the raw material powder is 10 percent or more and 40 percent or less; and
   wherein the depressurization speed is controlled at 2 kPa/min or less in the depressurization step.

2. The method of manufacturing a superconducting wire according to claim 1, further comprising the step of heat-treating the raw material powder at 400° C. or more and 800° C. or less before the raw material powder is filled in the metal pipe, the raw material powder being composed of an oxide superconductor or a precursor to become an oxide superconductor through heat treatment.

3. The manufacturing method of a superconducting wire according to claim 2, wherein the metal pipe is sealed by any one of electron beam welding, brazing, and pressure welding of an exhaust nozzle welded to the metal pipe.

4. The manufacturing method of a superconducting wire according to claim 1, wherein the metal pipe is sealed by any one of electron beam welding, brazing, and pressure welding of an exhaust nozzle welded to the metal pipe.

5. The method of manufacturing a superconducting wire according to claim 1, further comprising:
   heating the metal pipe filled with raw material powder after filling the powder material in the pipe and before depressurizing.

6. The method of manufacturing a superconducting wire according to claim 1, depressurizing comprising depressurizing to the pressure of 100 Pa or less.

7. A method of manufacturing a superconducting wire, comprising the steps of:

filling a raw material powder in a metal pipe, the raw material powder being composed of an oxide superconductor or a precursor to become an oxide superconductor through heat treatment;

heating the metal pipe filled with the raw material powder to 400° C. or more and 800° C. or less;

depressurizing the inside of the heated metal pipe to 100 Pa or less;

sealing an opening at an end portion of the metal pipe under the depressurized condition; and subjecting the sealed metal pipe containing the raw material powder to wire drawing, wherein the packing density of the raw material powder is 10 percent or more and 40 percent or less; and wherein the depressurization speed is controlled at 2 kPa/min or less in the depressurization step.

8. The method of manufacturing a superconducting wire according to claim 7, further comprising the step of heat-treating the raw material powder at 400° C. or more and 800° C. or less before the raw material powder is filled in the metal pipe, the raw material powder being composed of an oxide superconductor or a precursor to become an oxide superconductor through heat treatment.

9. The manufacturing method of a superconducting wire according to claim 8, wherein the metal pipe is sealed by any one of electron beam welding, brazing, and pressure welding of an exhaust nozzle welded to the metal pipe.

10. The manufacturing method of a superconducting wire according to claim 7, wherein the metal pipe is sealed by any one of electron beam welding, brazing, and pressure welding of an exhaust nozzle welded to the metal pipe.

* * * * *